United States Patent [19]

Cravens et al.

[11] Patent Number: 5,280,257

[45] Date of Patent: Jan. 18, 1994

[54] FILTER INSERT FOR CONNECTORS AND CABLE

[75] Inventors: David M. Cravens, Etters; Keith R. Denlinger, Lancaster; John M. Myer, Millersville, all of Pa.; John R. Hopkins, Cambridge, Md.

[73] Assignee: The Whitaker Corporation, Wilmington, Del.

[21] Appl. No.: 906,626

[22] Filed: Jun. 30, 1992

[51] Int. Cl.⁵ .............................................. H03H 7/00
[52] U.S. Cl. .................................. 333/182; 439/620; 333/183
[58] Field of Search ............... 333/181, 182, 183, 184, 333/185; 361/302, 329, 328, 330; 439/620, 607, 608, 609, 610, 97, 101; 29/832, 837

[56] References Cited

U.S. PATENT DOCUMENTS

| | | | |
|---|---|---|---|
| 4,144,509 | 3/1979 | Boutros | 333/181 |
| 4,729,752 | 3/1988 | Dawson, Jr. et al. | 439/620 |
| 4,781,624 | 11/1988 | Shepard | 439/620 |
| 4,804,332 | 2/1989 | Pirc | 439/620 |
| 4,853,659 | 8/1989 | Kling | 333/184 |
| 4,880,397 | 11/1989 | Dawson, Jr. et al. | 439/620 |
| 4,995,834 | 2/1991 | Hasegawa | 333/182 |
| 5,018,989 | 5/1991 | Black et al. | 439/620 |
| 5,081,434 | 1/1992 | Saramoto et al. | 333/182 |
| 5,094,629 | 3/1992 | Black et al. | 439/620 |
| 5,102,354 | 4/1992 | Crane et al. | 439/620 |
| 5,165,055 | 11/1992 | Metsler | 333/181 |

Primary Examiner—Raymond A. Nelli
Attorney, Agent, or Firm—Bruce J. Wolstoncroft

[57] ABSTRACT

A filter insert (40) includes filters (43) having electrodes (48, 60) and contacts (54, 64) axially, mechanically engaging contact post members (28) of a connector (20) to provide filtering extending between signal and ground conductors in the form of connector contacts to filter unwanted signal frequencies. An alternative insert (68) includes filters (69) having slotted beam elements (78) that engage post members (28) from a side thereof with a common ground bus (90) tying the filters to ground. A further alternative insert (108) provides contact elements (116) connecting filters (103) to signal and ground conductors in the form of the wires (104) of a cable (102). The contact elements (54, 64, 78, 116) of the inserts (40, 68, 108) bite into the signal and ground conductors or contacts of a connector or a cable to provide a solderless interconnection of the insert. Filters, including dielectric elements (56, 86, 126,) and inductive elements (44) are contemplated to provide C, LC and pi-filters.

31 Claims, 11 Drawing Sheets

FILTER INSERT FOR CONNECTORS AND CABLE

FIELD OF THE INVENTION

This invention relates to a device for filtering out unwanted frequency components of signals using an insert having contacts and filter elements that are attached to the signal and ground conductors of connectors or cable.

BACKGROUND OF THE INVENTION

Proliferation of electronic devices utilized to transmit, receive, and manipulate date has led to problems caused by electromagnetic interference (EMI) wherein radiation from voltages induced by the proximity of signals interferes with the transmission and reception of data signals, typically in the form of digital pulses. Additionally, a need has developed to protect the solid state and other circuit devices from electrostatic discharge (ESD), that can damage or destroy the sensitive and fragile elements of solid state devices. These two developments have led to a widespread use of filters of various kinds that operate, in one case, to filter out unwanted EMI from signal transmission, and in the other case, to filter out ESD voltage transits. One widespread use has been to provide filter elements proximate to circuit boards or to cable connected to such boards within connectors. U.S. Pat. No. 4,853,659 issued Aug. 1, 1989 is drawn to a planar pi-network filter assembly that utilizes capacitors and inductors incorporated into a connector to filter out unwanted components of signals transmitted through such connector. U.S. Pat. No. 4,729,752 issued Mar. 8, 1988 is drawn to a transit suppression device incorporated into a connector including a bi-directional diode incorporated as well as a filter means that functions to provide both filter and transit protection. Reference may be had to these prior art patents for a discussion or protection against surges and a filtering of signals from connector conductors.

In the foregoing examples and in many of the filters employed for both purposes, filtering and voltage surge protection, the elements, filters and/or diodes are fabricated with the electrodes thereof soldered to connector contacts, the post portions thereof, and to ground circuits to carry off the unwanted signal components or voltage transits to ground. Because of this, care must be taken relative to the particular solders used, connectors oft times being soldered to printed circuit boards after the assembly of the filter components and the use of solder in such assembly. Additionally, for many connector designs, the physical packaging required for filters simply will not fit within the dimensional parameters of the connector, making a retrofit difficult.

Accordingly, it is an object of the present invention to provide a filter insert that can be attached to the signal and ground conductors of transmission paths, connectors or cable, to effectively filter out unwanted signal components. It is a further object to provide an add-on filter insert that may be utilized with existing connector and cable designs which drastically reduces the use of solder. It is yet a further object of the invention to provide a novel connector or cable filter insert assembly in combination and readily applicable to closely spaced signal and ground conductors in connectors or cable or the like. It is finally an object of the invention to provide an interconnection between filter elements and signal and ground connectors that readily and easily can be applied without the use of solder.

SUMMARY OF THE INVENTION

The present invention achieves the foregoing objects through the provision of a filter insert attached to signal or ground conductors of connectors or cable to electrically insert filters therebetween, allowing wanted signal components to be shorted to ground. The filter insert of the invention includes, in one embodiment, a planar plastic housing having apertures therein on centers compatible with the contacts of a connector so that post portion of such contacts extending into such apertures engaging the post portions to interconnect thereto and connect the insert to ground and signal conductors of the connector. The insert contacts include sharp edge surfaces that bite into the post elements to provide a low resistance, stable interface therewith. Such contacts additionally interconnect to the electrodes of filter elements; selectively certain contacts engage post members that serve as signal carrying members and other post members that serve as ground carrying members. The electrodes of the filter element, typically the electrodes of a capacitor or a structure including an inductor and capacitor, are arranged so that assembly of the insert onto a connector effectively inserts the filter element between signal and ground conductors of the connector. Both capacitive and inductive filter elements are contemplated. In a further embodiment of the invention related to connectors, the housing of the insert is made to have contacts projecting from a side that includes a slotted beam structure adapted to be pushed onto the post member of a connector and to mechanically grip and electrically interconnect such post member to the filter element carried within the housing.

In yet a further embodiment of the invention, the contacts are formed into slotted beam structure, including surfaces adapted to strip away the insulation of cable and the filter insert may be used with cables having signal conductors and ground conductors interconnected by the contacts of the insert to provide an effective filtering to the signals carried by the cable. In such embodiment, the housing is made to include apertures allowing the designation of ground and signal contacts with a shunt member being positioned on such housing to effect such selection.

In this way, a filter insert may be incorporated into a connector or a cable without the use of solder and may be added to many designs of existing connectors and cable having signal and ground conductors on close centers.

DETAILED DESCRIPTION OF THE INVENTION

Figure 1:
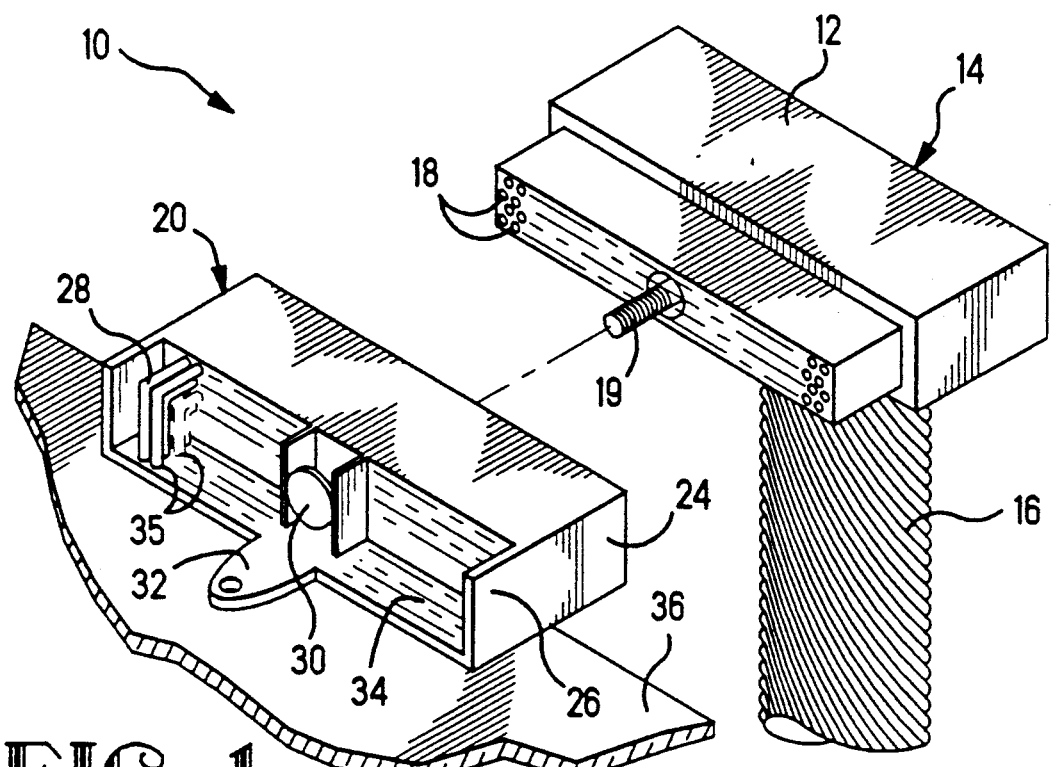
FIG. 1 is a perspective view of a connector of a type utilizing the present invention showing one connector half attached to a circuit board and another half displaced therefrom preparatory to engagement.

Referring now to FIG. 1, a connector assembly 10 is shown to include a connector half 12 having a housing 14 with a cable 16 comprised of wires connected to an array of contacts 18. A fastener 19 mechanically holds connector half 14 to mating half 20 that includes an array of pin contacts that mate with the contacts 18 of half 14, the contacts of half 20, not shown, being recessed within a shroud 24. Half 20 includes a rear portion 26 with an array of contacts including post members 28 that extend from the forward face of connector half 20 in right angle bends down through a floor 34, apertured as at 35, of the rear portion 26. The rear face of a fastener 19, it being understood that the forward portion of half 14 is drawn within the shroud 24 of half 20 by such fastener to interconnect contacts of the two halves. As can be seen in FIG. 1, a bracket 32 extends out over a circuit board 36 to hold the connector half to such board, at least during assembly and soldering operations. The board 36 may be understood to include circuit traces on top and bottom surfaces and therewithin, in the form of laminations, such traces leading to and from components carried by such board. The ends of the contact post members 28 are to be understood to extend down through holes in board 36 to be joined to the traces selectively to define input/output functions, the connector 10 being understood to be an I/0 connector. In accordance with practice consistent with specifications and regulations, imposed upon electronic circuits regarding EMI and ESD, it is frequently necessary to filter out unwanted signal components carried by the wires of cable 16 through the contacts 18 and posts 28 to the traces on board 36, or the reverse in terms of signal propagation from the board out through the I/0 connector.

In FIG. 1, most of the posts, including post members 28, are shown removed to reveal the interior of the connector half 20.

The representation in FIG. 1 is typical of applications wherein filtering of unwanted signals in or proximate to an I/0 connector is required. With respect to the prior art patents mentioned, the filtering structures would be fitted within the connector half 20. These would typically include filters having a capacitance C, filters having an inductance L and a capacitor C to define an LC or a pi-LC network. In such cases, the capacitors C would be inserted between certain of the posts 28 connected to signal contacts, contacts that carry the signals from cable 16, and others of the post members 28 would be connected to ground contacts in turn connected to grounding circuits carried by board 36 or grounding wires of cable 16 through the contacts of the mating half 14. Alternatively, grounding circuits may be carried by the housing of the connectors if such are made of metallic material which is in turn grounded to grounding circuits carried by the mating half or by the circuit board 36. Typically, it is these filter elements that take the unwanted signal components to ground and thus preclude their transmission on the signal contacts. With respect to the description hereinafter to follow, it is to be understood that the conductive paths, signal and ground, include the wires of the cable 16, selectively one or the other, as well as the various contacts and post members and traces within board 36. The invention also contemplates an application with filters of the type that are termed absorptive filters that operate to convert unwanted frequencies to heat rather than shunting such frequencies or the components thereof to ground. The invention also contemplates the employment of a wide range of other filters and/or transient protectors installed in inserts fitted to connectors or cable.

Figure 2:
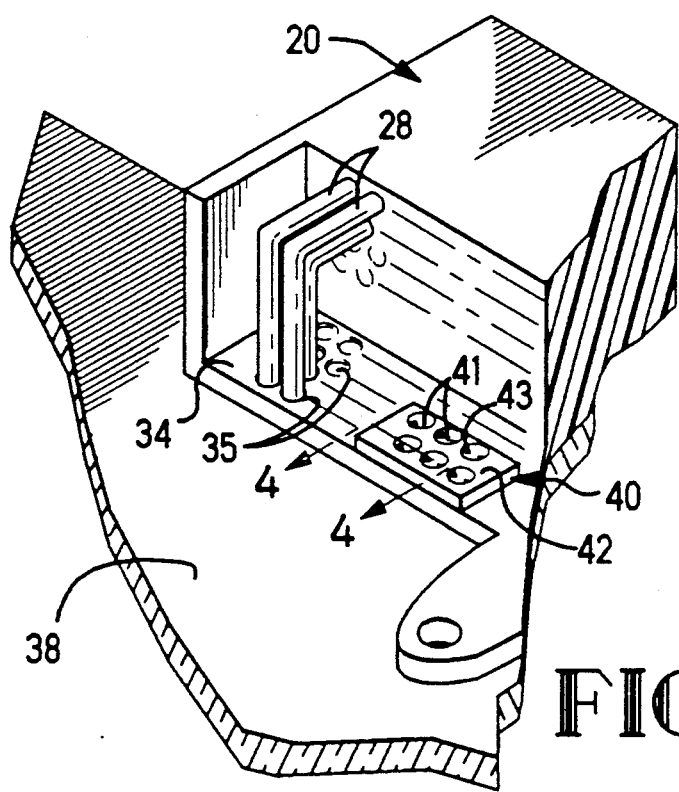
FIG. 2 is a perspective view of a connector similar to that shown in FIG. 1, the left half portion thereof, showing a filter insert installed therein with the posts removed for clarity relative to such insert.

Referring now to FIG. 2, a portion of the connector half 20 including the post members 28 may be seen in two rows extending down through the floor 34, through apertures 35 in such connector. Just adjacent the array of post members 28 is a filter insert 40 shown resting on floor 34, without post members extending therethrough, the insert 40 being understood to be applied to posts not here shown. In practice, insert 40 would be fitted over post members 28 prior to the application of the base member 34 with the post members inserted through the apertures 41 in housing 42 of insert 40. Contained within selected apertures 41 are filter elements 43 that are connected to the contacts through the post members 28 to provide a filtering action for signals transmitted by such post members. The left-hand apertures 42 of insert 40 are, in this embodiment, made to receive post members 28 inserted therethrough and designated as ground circuits, the left-hand apertures including interconnections to such posts to provide a grounding for the insert and filter elements 43 contained therein.

Figure 3:
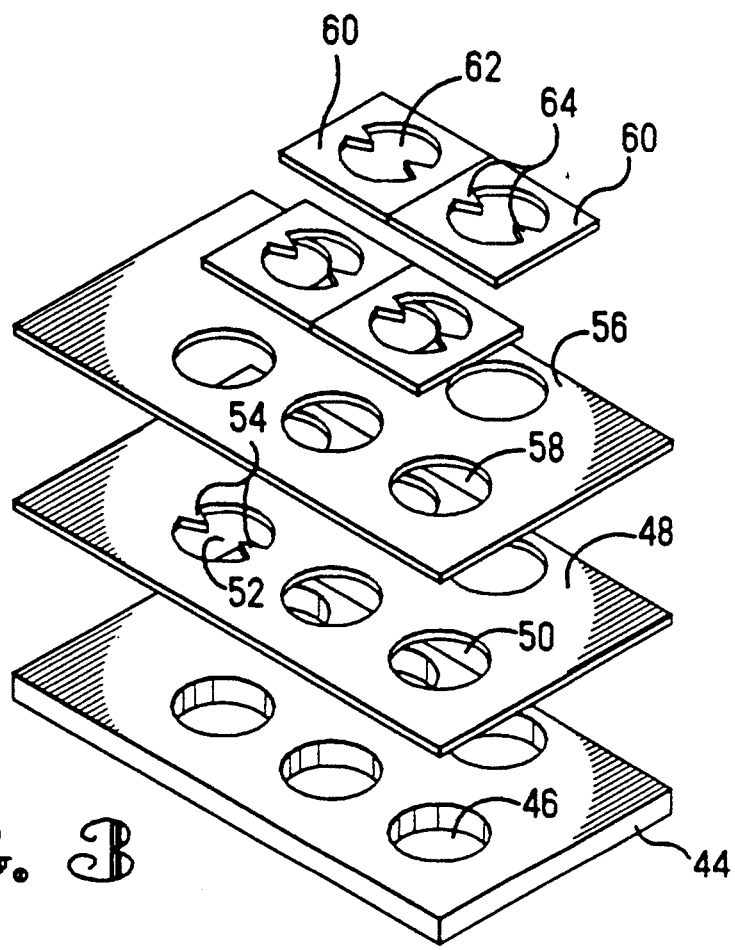
FIG. 3 is an exploded view, showing in perspective, the elements forming the insert shown in FIG. 2.
Figure 4:
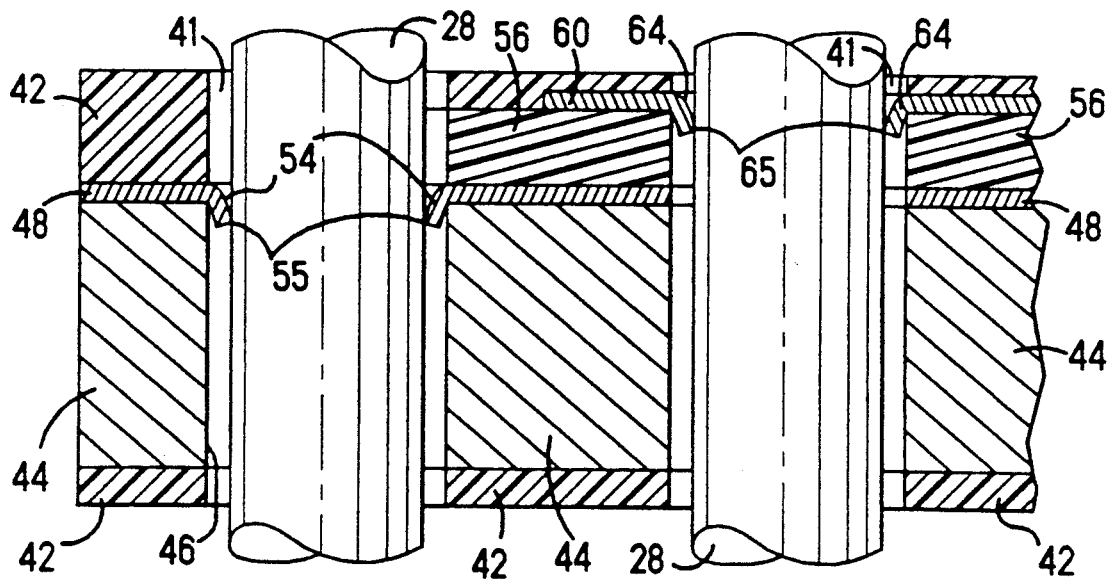
FIG. 4 is a side, sectional view taken from lines 4—4 through the insert shown in FIG. 2.

Referring now to FIG. 3, the insert 40 is shown with the plastic housing material removed and with the elements therein exploded to show detail. There is included on the bottom a plate 44, preferably of a ferrite material having an inductance L and including apertures 46 through which the post members 28 extend to be included by the inductance of plate 44. Above plate 44 is an electrode formed of a thin conductive layer which, in the embodiment represented, is made to include spring characteristics. Apertures 50 are provided, through which post members 28 pass, and, on the left, apertures 52 are included with contacts 54 extending within the apertures. Above electrode 48 is a dielectric member 56 having capacitive characteristics and including a series of apertures 58 disposed in the surface thereof. Adjacent member 56 are further electrodes 60 each including an aperture 62 with contacts 64 protruding into such aperture. It is to be noted that no electrodes 60 are provided for the left-hand apertures that serve to provide access to a grounding function. Referring to FIG. 4, the elements shown in FIG. 3 are represented assembled in housing 42 through a section taken along lines 4—4 of FIG. 2 with the addition of post members 28 extended through the apertures 41 shown in FIG. 4. As can be discerned, the plastic housing material 42 extends across the upper and lower surface of the insert, and also extends over the sides and ends of such insert as shown in FIG. 2. Housing 42 may be formed by insert molding around the structure contained there within in a well-known matter.

Figure 10:
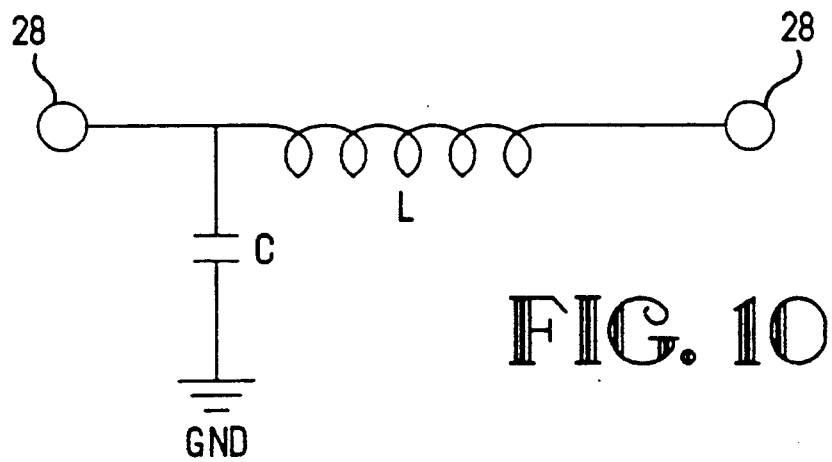
FIG. 10 is an equivalent circuit of the filter represented in FIG. 9.

The various elements shown in FIG. 3 can be seen in FIG. 4 with the contacts 64 of the upper electrode shown engaging the sides of signal post member 28 in the left-hand side of FIG. 4 to interconnect electrode 48 to a grounding circuit, namely, the grounding post member 28 inserted through to engage such contacts. The contacts are preferably made to have sufficient spring characteristics to be deflected to drive end edge surfaces 55 and 65 into the surfaces of post members 28. As can be appreciated, the contacts that are assigned signal carrying functions, including the post members 28 thereof, are interconnected to the grounding path of contacts including post members 28; to thus insert a capacitance in each signal contact and signal path. The presence of plate 44 serves to provide an inductance L for each signal path. Each signal path of insert 40 thus is made to include an LC network operable to filter out unwanted components of signal frequencies transmitted by the signal bearing contacts of the connector. An equivalent circuit of such filter is shown in FIG. 10 where the inductance L and capacitance C can be visualized in relation to contact member 28 and a ground circuit.

Figure 5:
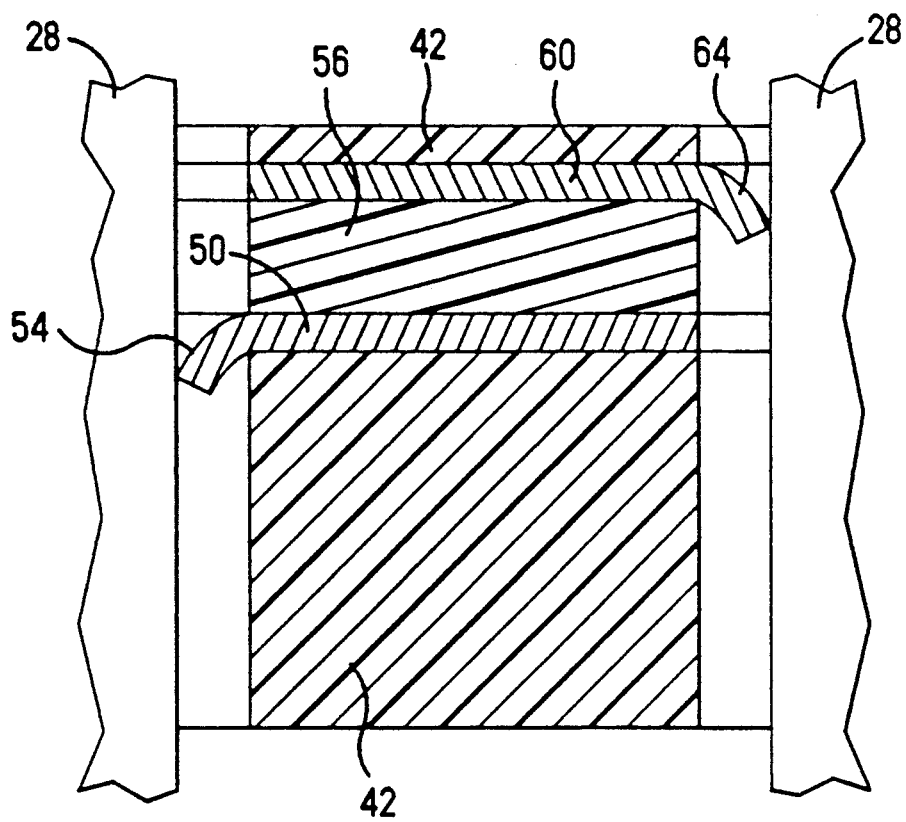
FIG. 5 is a side, sectional view of an alternative embodiment of a portion of the insert of the invention.
Figure 6:
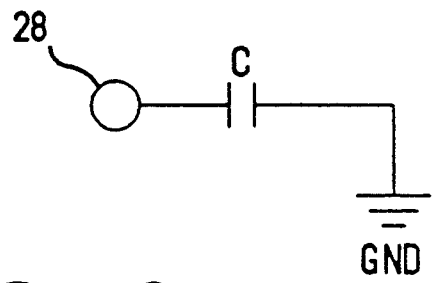
FIG. 6 is an equivalent circuit of the filter structure represented in FIG. 5.

FIG. 5 shows an alternative embodiment of an insert, reference being had to portions of the post members 28, the housing material 42, dielectric 56 and the various electrodes and contacts associated with the electrodes 48 and 60. This alternative embodiment of insert 40 includes no inductance 44, housing material 42 occupying such volume. FIG. 6 represents an equivalent circuit for the filter arrangement shown in FIG. 5 with a capacitance C shown in relation to a contact member 28 of a signal path and ground.

Figure 7:
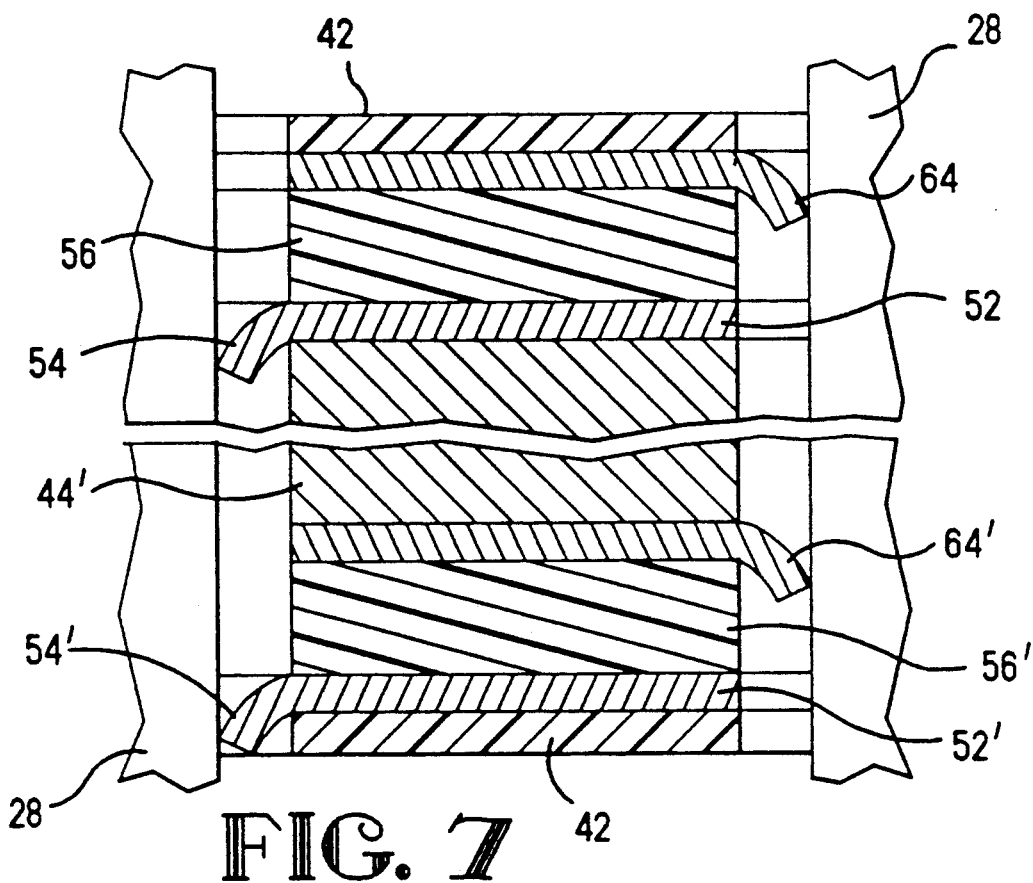
FIG. 7 is a side sectional view of a portion of an insert of yet a further embodiment.
Figure 8:
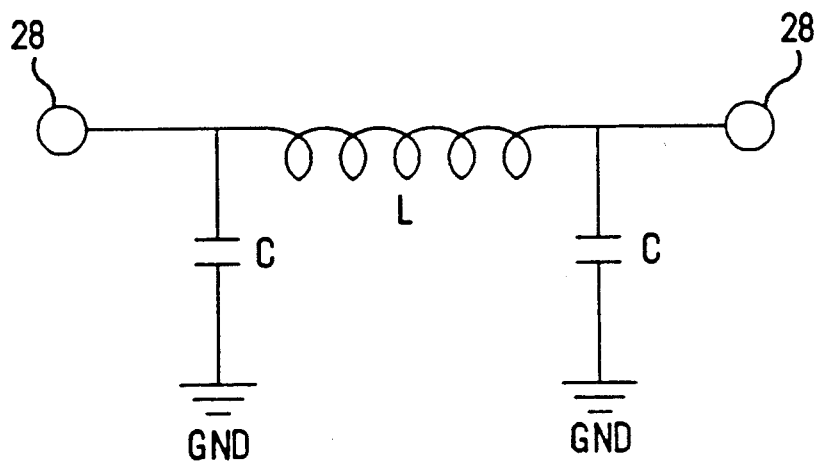
FIG. 8 is an equivalent circuit of the structure of the filter shown in FIG. 7.

FIG. 7 shows a further alternative embodiment including two capacitive elements 56 and 56', each having appropriate electrodes including contacts 54 and 64 and contacts 54' and 64' as shown. There is provided a single, common inductive plate 44' between the capacitors and the filter element provides a pi-network of a configuration shown in FIG. 8.

Figure 9:
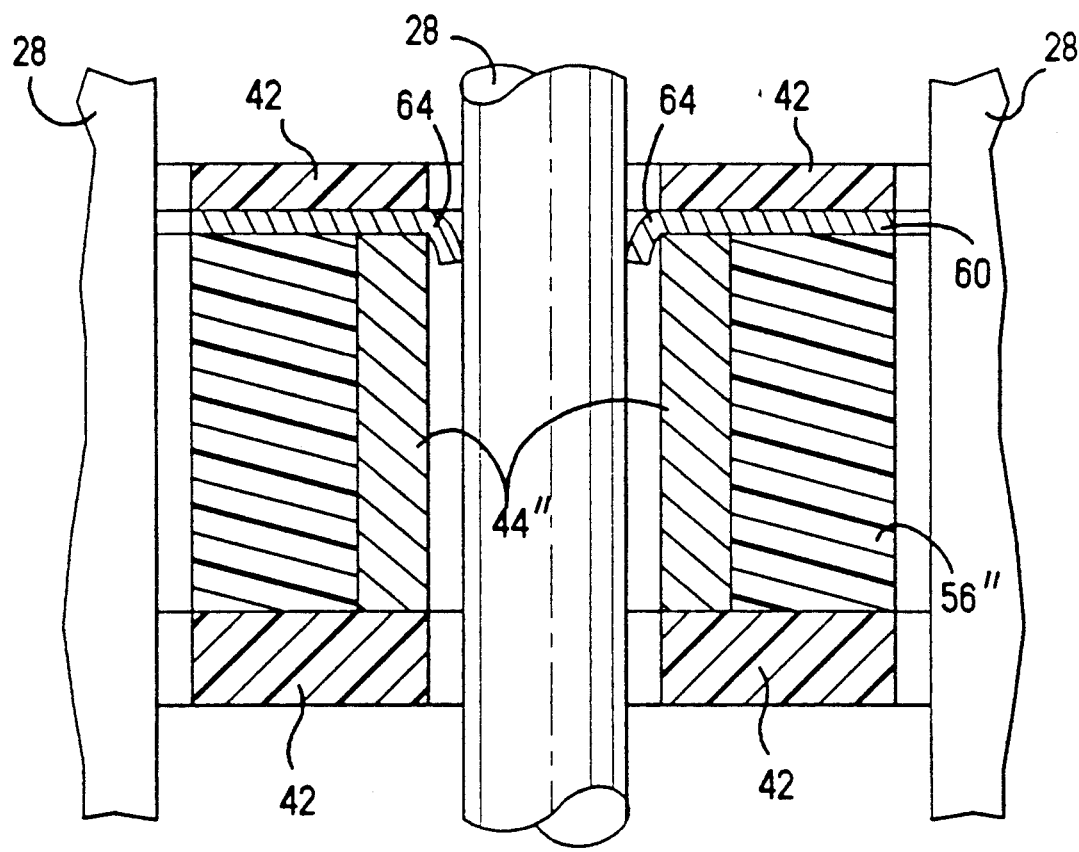
FIG. 9 is a side, sectional view of yet a further alternative embodiment of the insert and filter of the invention.

FIG. 9 shows an embodiment of the invention with a common numbering of elements to include the housing 42 and a much thicker dielectric element 56' with there being provided a ferrite sleeve encircling post member 28, the sleeve being shown as 44". With respect to the filter element of FIG. 9, the grounding circuit is not shown but would be essentially like that previously described with respect to FIG. 4. The equivalent circuit of the filter element shown in FIG. 9 is shown in FIG. 10 to include an inductance L and capacitance C relative to the post member 28 and ground.

Figure 11:
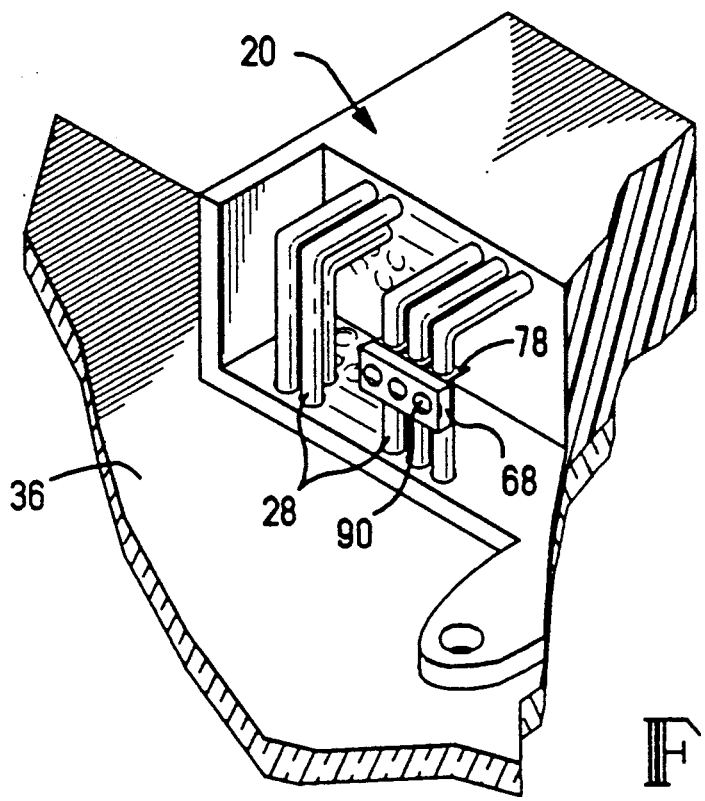
FIG. 11 is a perspective view showing a connector half like that shown in FIG. 1, modified to show yet a further embodiment of the invention installed on post members of a connector.
Figure 12:
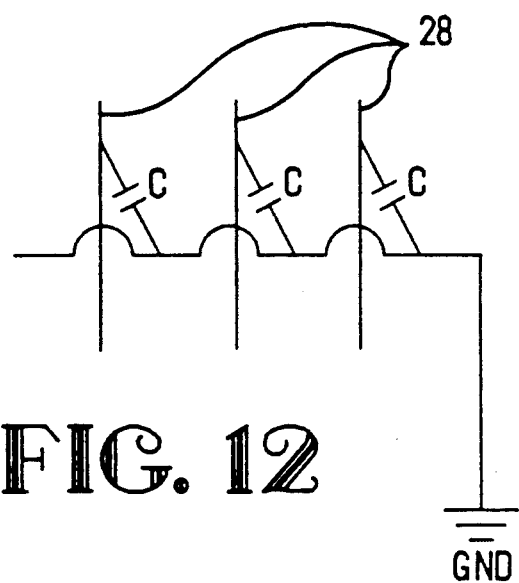
FIG. 12 is an equivalent circuit of the filters carried by the structure shown in FIG. 11.
Figure 13:
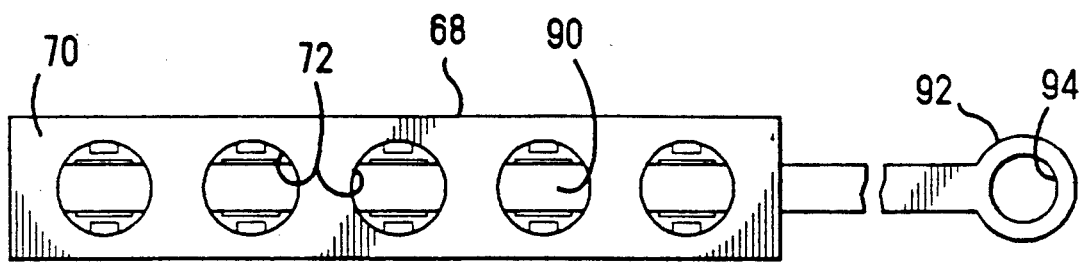
FIG. 13 is a plan view of a filter insert, similar to that shown in FIG. 11.
Figure 14:
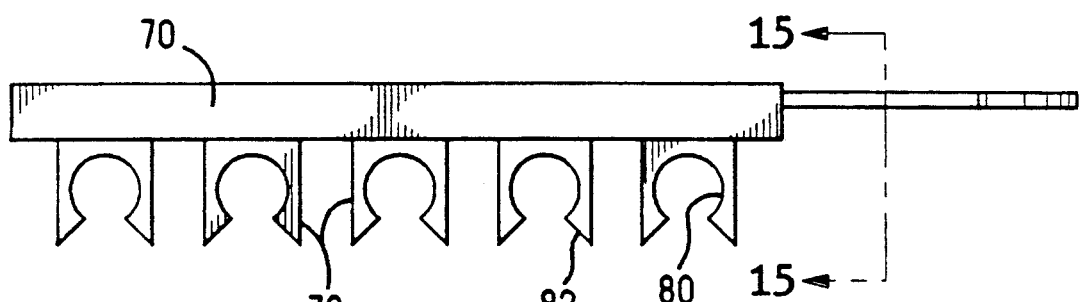
FIG. 14 is a side, elevational view of the insert shown in FIG. 13.
Figure 15:
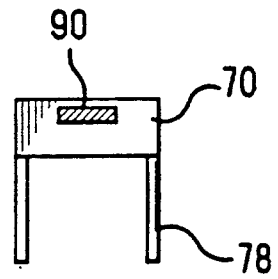
FIG. 15 is an end view of the insert shown in FIG. 14 taken from lines 15—15.
Figure 16:
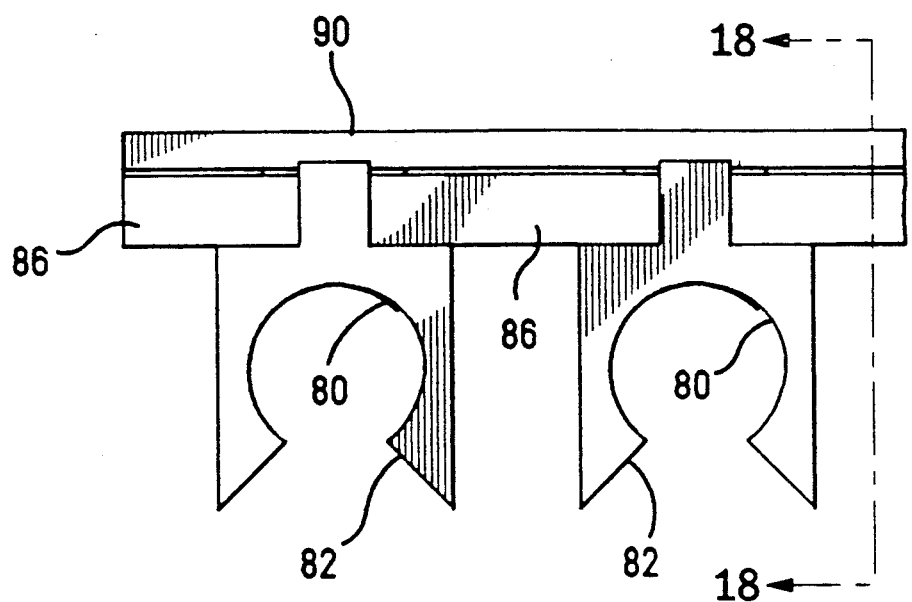
FIG. 16 is a side view of the insert shown in FIG. 14 with plastic removed.
Figure 17:
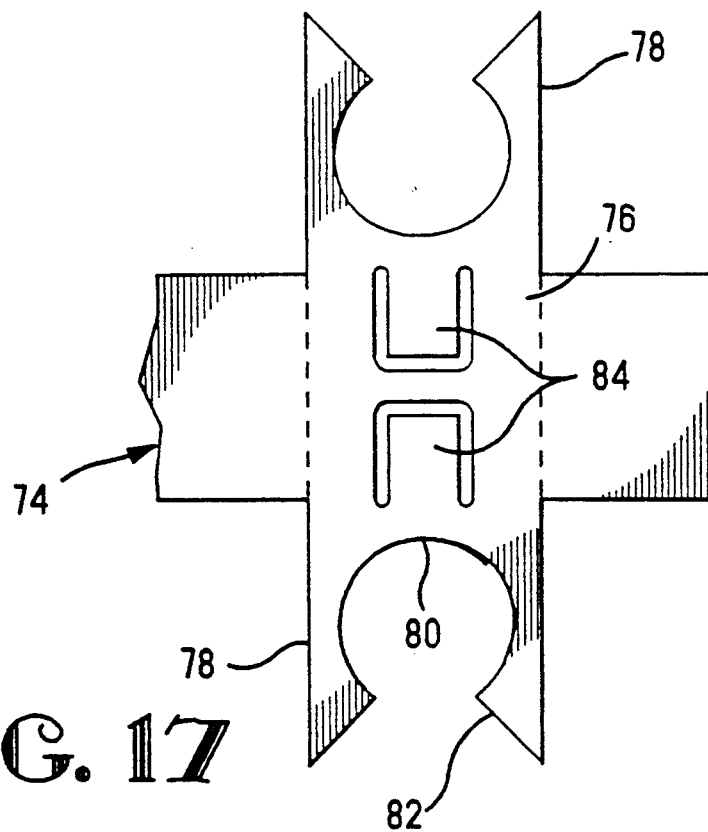
FIG. 17 is a plan view of the conductive portions including contacts of the embodiment shown in FIGS. 13-16.
Figure 18:
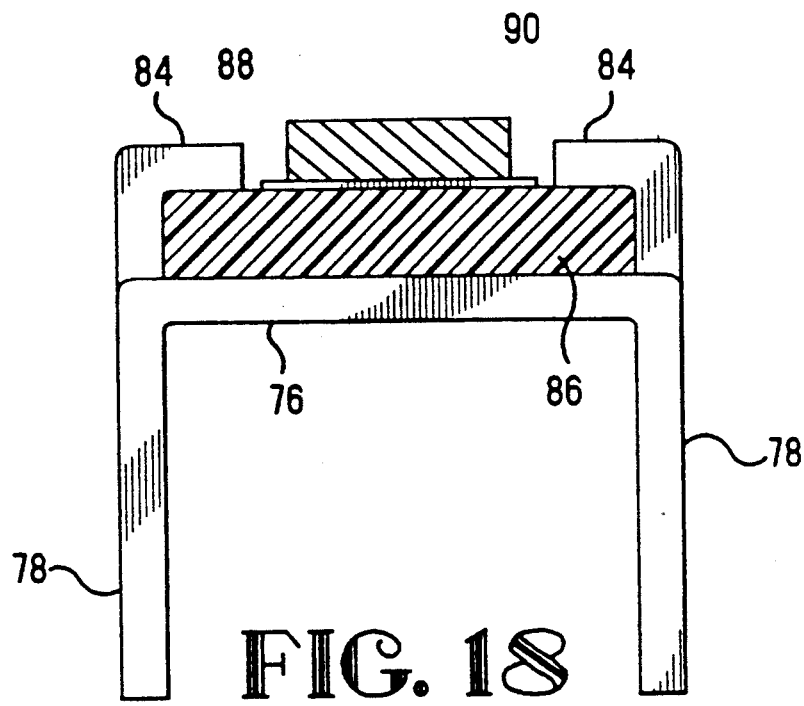
FIG. 18 is an enlarged, side, elevational, and partially sectioned view taken through lines 18—18 of FIG. 16.
Figure 19:
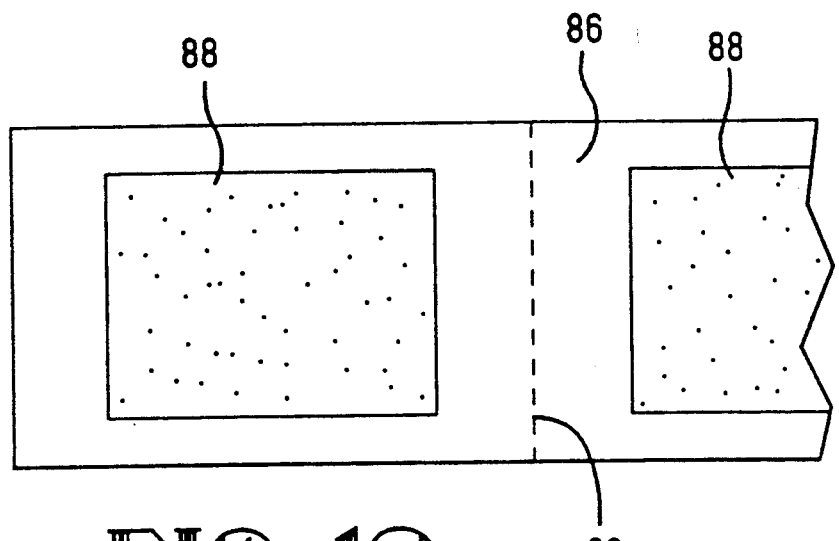
FIG. 19 is a plan view of the capacitive portion of the capacitor structure utilized in the embodiments of FIGS. 13-18.

Referring now to FIG. 11, the left and part of a connector half 20 is shown, the posts 28 shown relative to board 36. There, a portion of a filter insert 68 is provided, including three filters 69, interconnected to three of the post members 28 to provide an equivalent circuit as shown in FIG. 12 with capacitance C inserted between each of the post members and ground. FIG. 13 shows the insert 68 having five positions. As can be seen, insert 68 includes a housing 70, of plastic material molded around the series of filter elements 69 contained within the housing. In this embodiment, an aperture 72 may be optionally provided in the top surface of the housing 70 providing access to electrodes within the housing. FIG. 14 shows a side view of the insert 68 and FIG. 15 shows an end view thereof. FIG. 16 shows a section of the insert with the plastic removed to reveal the interior components, and FIG. 17 shows a metallic base member 74 stamped but prior to forming. The base member 74 includes a carrier strip 76 which is sheared away to leave the outline revealed in FIG. 17 by the dotted lines and remaining solid portions. As can be discerned, the base member includes oppositely projecting slotted beam elements 78 that have beveled entry surfaces 82 leading to a rounded post receiving surface 80. Elements 78 are spaced apart to provide a tight, firm grip of posts 28 to provide a low resistance, stable electrical interconnection as well as a physical gripping of the posts 28. Additionally, in the base member are tabs 84 struck out as indicated in FIG. 17. FIG. 16 shows the base members, two of them, in side view, with the slotted beam elements 78 projecting downwardly. As can be seen in FIGS. 16 and 18, portions 76 of base member 74 include a dielectric element 86 mounted thereon with the projections 84 deformed to hold element 86 against 76. The dielectric element 86, as shown in FIG. 19, is made continuous and includes a series of electrodes 88 formed as by silk screening and firing of conductive material therealong. In the embodiment shown in FIGS. 13-18, the dielectric material 86 is made continuous to be common with all of the slotted beam elements 78. It is contemplated that the dielectric element 86 may be cut apart as by shearing along a line 89 as shown in FIG. 19 to make the dielectric elements individual to the filter elements.

In operation, the base portion 76 and electrode 88 serve as plates or electrodes for a capacitor C with the legs 78 interconnecting 76 to a given post member 28 in the manner shown in FIG. 11. A bus member 90 interconnects with each electrode 88 to carry unwanted frequencies passed by the capacitance formed by dielectric 86 to a grounding circuit via an extension leading to a terminal 92 apertured as at 94 to be attached to a grounding circuit, shell of a connector, or the like. In practice, signals transmitted by post members 28 having unwanted frequency components, are in essence filtered by the capacitances of the discrete filter elements for each of the filter elements of the insert 68, effectively inserting capacitances C as shown in the schematic diagram of FIG. 12.

Figure 20:
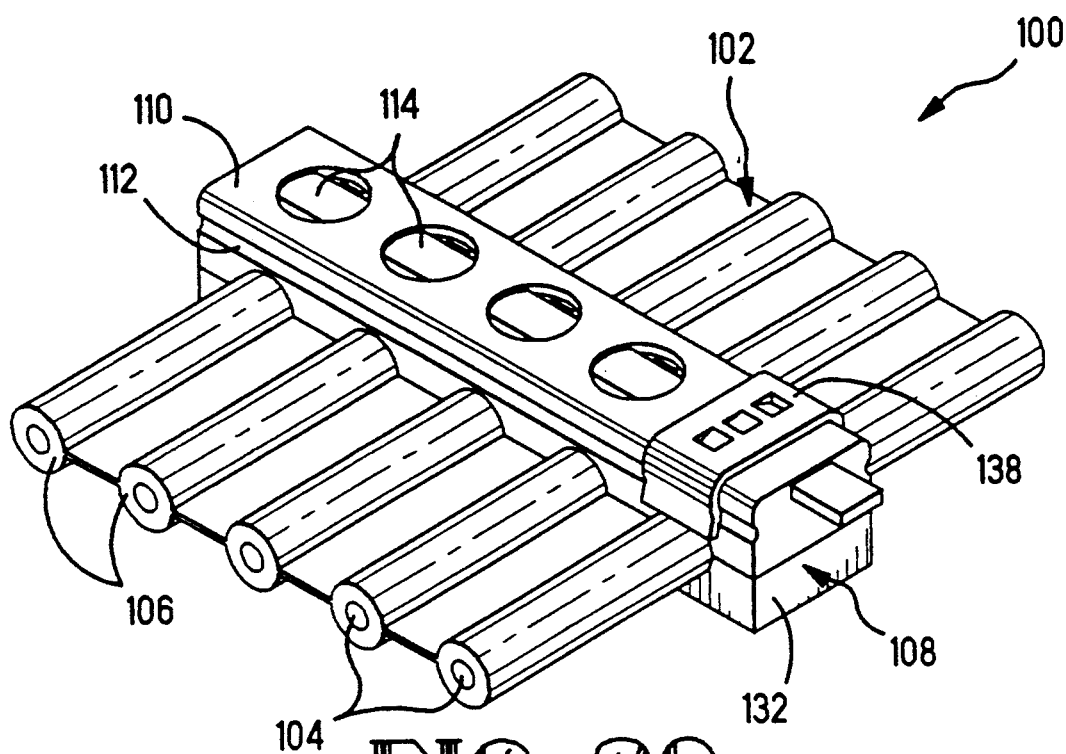
FIG. 20 is a perspective of a multi-conductor cable including a filter insert in an alternative embodiment adapted to be utilized with such cable.
Figure 21:
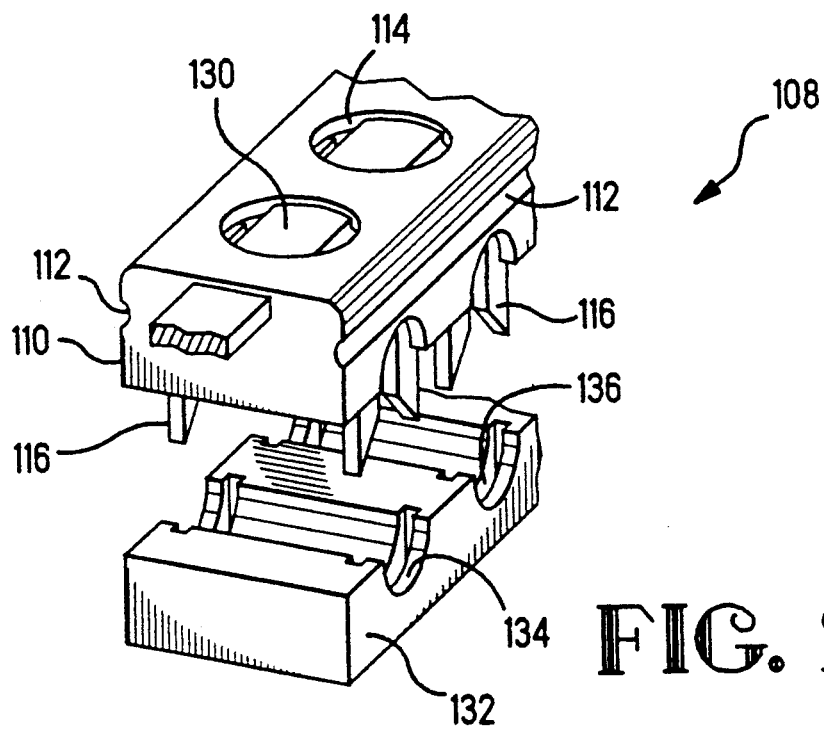
FIG. 21 is a schematic view taken from the end of the insert shown in FIG. 20 with the top and bottom elements shown spaced apart and without the cable included.
Figure 22:
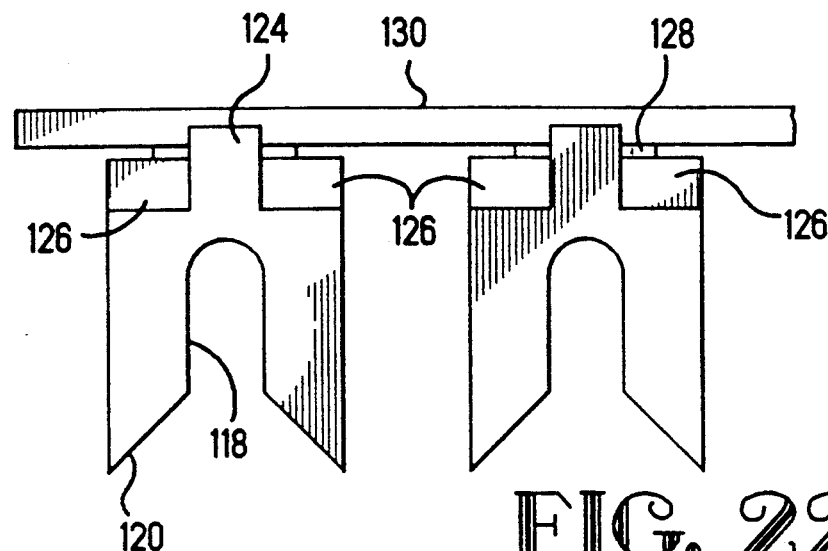
FIG. 22 is a side, elevational view of the filter and contact elements of the insert shown in FIGS. 20 and 21, with plastic material removed therefrom for clarity.

A given aperture 72 may be filled with solder or conductive plastic to short out the grounding bus 90 to a selected ground post. Referring now to FIG. 20, an adaptation of the filter insert of the invention is shown relative to cable in an assembly 100 including a cable 102 of wires 104 insulated as at 106 representing a multi-conductor ribbon cable. An insert 108 is shown to include a plastic housing comprised of an upper portion 110 and a lower portion 132. The upper portion includes grooves in the side shown as 112 and a series of apertures 114 extending across the upper surface of housing portion 110. As shown in FIG. 21, insert 108 contains in upper portion 110 a series of contacts, including legs 116, also shown in FIG. 22, that projects outwardly from portion 110 to include slotted beam surfaces 118 of a diameter to bite into cable wires 104. The contacts have beveled surfaces 120 that operate to center the contact relative to cable wires 104 and pierce the insulation 106 of such wire upon closure of the two parts of the insert, portions 110 and 132. The lower portion 132 includes rounded surfaces 134 and slots 136 that receive legs 116 as the parts are closed upon the cable to the position shown in FIG. 20.

Figure 23:
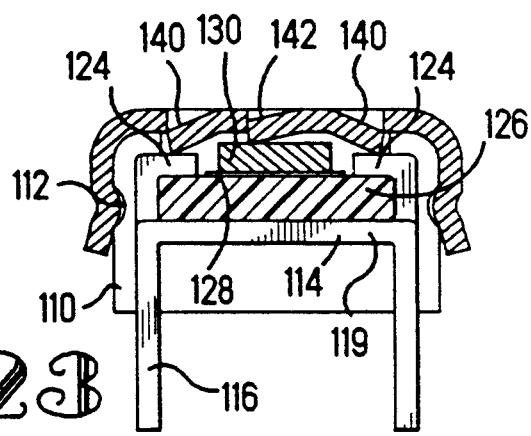
FIG. 23 is an end, elevational, and partially sectioned view taken through a portion of the insert shown in FIG. 21.
Figure 24:
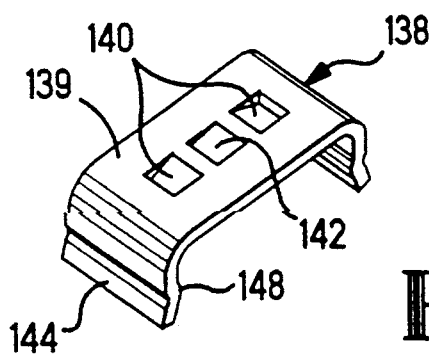
FIG. 24 is a perspective view of a shorting clip of the insert shown in FIG. 20.

The contacts are formed of spring grade stock to provide a low resistance interface with wires 104. Extending from legs 116 are tabs 124 that are deformed to clamp a dielectric element 126 in the manner shown in FIGS. 22 and 23. On the upper surface of each dielectric element 126 is a thick film conductor 128 suitably fired thereon, and there is provided a bus 130 common to all individual elements of the insert, bus 130 shown in FIGS. 23 and 24. In practice, signals carried by wires 104 are interconnected through legs 116 to the dielectric elements 126, the base 119 providing one electrode of a capacitor, and the thick film 128 providing the other electrode, with such electrode connected by the bus 130 to ground. In accordance with one embodiment of the invention, a ground may be provided by selecting one or more of the wires 104, the right-hand most wire shown in FIG. 20, for example, and in essence, shorting out the bus 130 to the ground wire through the legs 116 of the right-hand most contact element. This is achieved in the embodiment shown in FIG. 20 by the use of a clip 138 shown in FIGS. 20 and 24. The clip 138 is preferable formed of a spring grade metallic stock, stamped and formed to include a top portion 139 having a series of tabs 140 and 142 struck out to project downwardly in the manner shown in FIG. 23 and engage the conductive portions of the contact. Thus, tab portions 140 engage the projections 124 that in turn are integral with leg portions 116 and tab portions 142 engages bus 130 to short out the bus to wire 104 selected as a ground. This in essence interconnects the signal wires of the cable through discrete capacitances C to a ground circuit. As can be appreciated from the showing in FIGS. 20, 23, and 24, the grounding clip 138 fits on the upper portion 110 of the housing in a fashion to be slid along the housing, the portions 148 fitting within grooves 112 and the projections 140 and 142 deforming resiliently to allow the clip 138 to be positioned on any aperture 114 to thus selectively position the clip and commoning thereof of an appropriate grounding wire.

With respect to the embodiment shown, particularly in FIGS. 13 and 20, it is to be understood that variations of the features may be exchanged, including the use of individualized dielectric elements, common dielectric elements, the clip 138, applying as well to the embodiment of FIG. 13. It is also contemplated that in lieu of the extension of the bus 90 to include portions 92 and 94, a clip 138 may be employed with one of the post members 128 selected as ground and with the clip positioned to common out the bus 90 to the projections 84 of the insert.

With respect to the foregoing, the invention contemplates that by providing appropriate dielectric materials with appropriate thicknesses, and inductive materials with appropriate characteristics and thicknesses, the invention may be utilized to define filters having characteristics appropriate to a particular use and compatible with different cost restraints, both for inserts designed to fit existing connectors, to be retrofitted therein, or with respect to newly designed connectors. While the invention is shown with contacts in the embodiment of FIGS. 2-10 formed integrally with the electrodes as for example, the contacts 54 formed from electrode 48 for the contacts 64 formed from electrode 60, the invention also contemplates that such electrodes may be formed of thin foil or silk screened thick film material, suitably fired, on inductive or capacitive materials with the contacts, such as 54 and 60, formed separately of spring grade material having tabs electrically and mechanically connected to the electrodes and held therein by the material of housing such as 42. In all events, the contacts should be made to provide sufficient normal forces engaging the post members 28 to provide low resistance, stable electrical interfaces, and should have mechanical characteristics accomplishing this end without unduly stressing either the electrodes to which they are attached or the components, capacitive or inductive, which they serve.

Although the connector assembly described provides an electrical connection between two printed circuit boards, the principal of the invention can be utilized in other types of connector assemblies, i.e a cable to board connector assembly.

Having now described the invention in several preferred embodiments, claims are appended to define that deemed inventive.

We claim:

1. A filter insert for use in filtering out unwanted signal frequency components from signals transmitted by connectors, cables and the like having signal and ground conductors, said filter insert including a first contact having at least a contact surface and means to force said contact surface into engagement with a signal conductor to provide a low resistance, stable electrical interface therewith, a filter element having signal and ground electrodes, means connecting said signal conductor to said signal electrode of said filter insert further means for electrically connecting said ground electrode of said filter insert to said ground conductor of said connectors, cables and the like to provide an effective filtering of said unwanted signal frequency components by conducting said components to ground.

2. The insert of claim 1 wherein said surface includes at least an edge operable to bite into the signal conductor to grip such conductor mechanically and provide said interface.

3. The insert of claim 1 wherein said first contact includes at least two edge surfaces engaging said signal contact on at least two sides to mechanically grip said signal contact and electrically interconnect the contact to the signal electrode of said element.

4. The insert of claim 1 wherein said first contact includes portions encircling said signal conductor.

5. The insert of claim 1 wherein said first contact includes portion defining a slotted beam gripping said signal conductor.

6. The insert of claim 5 wherein said slotted beam includes at least two edge surfaces shaped to penetrate insulation and grip a signal conductor therewithin to effect a mechanical connection thereto.

7. The insert of claim 5 including a further contact having at least a further surface engaging the ground conductor and further means to force said contact into engagement with said ground conductor to provide a low resistance, stable electrical interface.

8. The insert of claim 5 wherein there is provided a further contact having slotted beam portions adapted to engage the said ground conductor and provide a low resistance, stable interface therewith.

9. The insert of claim 1 including a plurality of filter elements for a plurality of signal conductors and at least one ground conductor.

10. The insert of claim 9 including means to selectively interconnect one or more of the first contacts of the filter element to a ground conductor.

11. In combination, a plurality of signal conductors adapted to transmit signals and at least one ground conductor, a filter insert including a filter element for filtering out unwanted signal components, said insert including signal and ground electrodes, a first signal contact connected to a signal electrode and a second contact connected to a ground electrode, and at least one of said signal contacts having a surface and means to force said surface into engagement with said signal conductor to provide a solderless low resistance, stable electrical interface therewith.

12. A combination of claim 11 wherein a said plurality of signal conductors are the contacts of an electrical connector.

13. The combination of claim 11 wherein the plurality of signal conductors are the conductors of an electrical cable.

14. The combination of claim 11 wherein the said plurality of signal and ground conductors are the conductors of either an electrical connector or an electrical cable.

15. The combination of claim 11 wherein the said first contacts include slotted beam portions adapted to grip signal conductors mechanically and provide the holding of said conductors and an electrical connection therewith.

16. A filter insert for use with signal and ground conductors intended to filter out unwanted frequency components from such conductors including a plastic housing containing at least one filter element having signal and ground electrodes and at least one contact connected to the signal electrode with said contact having at least one contact surface extending from the said housing to engage a signal conductor and interconnect mechanically therewith to electrically connect the signal electrode of said filter element to a signal conductor and further including means adapted to connect the ground electrode to a ground conductor to insert the filter element between signal and ground conductors.

17. The insert of claim 16 wherein the said filter element is a planar device having a series of holes adapted to receive signal conductors inserted there through with a said first contact extending within said hole to drive said contact surface to engage the signal conductor.

18. The insert of claim 16 wherein the said filter element housing includes a side with each contact extending therefrom to engage signal conductors external to said housing.

19. The insert of claim 16 wherein said contact includes a slotted beam portion operable to grip the signal conductor.

20. In combination, a connector having an array of contacts each including a post portion adapted to carry signals, a housing holding said contact and post portion on given centers and a filter insert including a filter for each post portion adapted to filter out unwanted frequency components of the said signal, the said filter further including a signal electrode and a ground electrode with at least a capacitive filter connected there between and further including a first contact connected to a post portion having surfaces to grip said post portion and provide a mechanical and electrical connection of said first electrode to the post portion, means connecting said second electrode of said filter to said ground circuit to insert said filter between a signal ground path and ground circuit to carry the unwanted frequency components to ground.

21. The combination of claim 20 wherein the said filter includes a ferrite element having portions surrounding a post portion and providing an inductance L to form, with said capacitance, and LC network to remove unwanted signal components from the contacts of said connector.

22. The combination of claim 20 wherein the said signal conductors are the wires of an electrical cable and the said first contact includes a slotted beam portion adapted to penetrate insulation of said cable and terminate said contact to a conductor wire of said cable.

23. For use with a plurality of signal conductors and at least one ground conductor forming a transmission circuit, a filter insert having a plurality of filter elements including at least a capacitor having signal and ground electrodes on either side thereof, at least one slotted beam contact connected to the signal electrode and having portions to grip and mechanically and electrically interconnect such electrode to a signal conductor and means to connect a ground electrode to a ground conductor to insert the filter in the transmission circuit to remove unwanted frequency components from said circuits.

24. The insert of claim 23 including a plurality of contacts in a row on given centers adapted to engage a plurality of post portions of the said contacts on said given centers.

25. The insert of claim 23 wherein the said slotted beam contacts include surfaces adapted to penetrate the insulation of cable and a slot to terminate to the wire of said cable.

26. The insert of claim 23 further including a ground member coextensive with each slotted beam contact with means provided to interconnect a given slotted beam contact to said ground member to provide a ground connection to a said insert.

27. The insert of claim 23 including a plastic housing covering over the said filler elements and mechanically holding the various elements together, with an aperture exposing the contacts of said elements to facilitate a selective grounding of said elements.

28. In a transmission medium, including signal conductors and ground conductors spaced on given centers, a filter insert including a housing containing an array of filters therein with contacts positioned on said centers having ends adapted to engage certain of said signal and ground conductors as an entity added to the transmission medium and including first contacts, each separately engaging a signal conductor and at least a further contact engaging a ground conductor, a filter element for each signal and ground conductors including electrodes interconnected to said first and further contacts to insert the filter between signal and ground conductors to filter out unwanted signal components.

29. The filter insert of claim 28 wherein the said conductors are formed from portions of the contacts of a connector.

30. The insert of claim 28 wherein the conductors are the conductors of a transmission cable.

31. The insert of claim 28 wherein the said filter elements include a capacitance C and/or an inductance L, and combinations thereof.

* * * * *